United States Patent
Raszka et al.

(10) Patent No.: US 11,152,046 B1
(45) Date of Patent: Oct. 19, 2021

(54) SRAM BIT CELL RETENTION

(71) Applicant: Apple Inc., Cupertino, CA (US)

(72) Inventors: Jaroslav Raszka, San Jose, CA (US);
Shahzad Nazar, Fremont, CA (US);
Jaemyung Lim, Sunnyvale, CA (US);
Mohamed H. Abu-Rahma, Mountain View, CA (US); Victor Zyuban, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/931,870

(22) Filed: Jul. 17, 2020

(51) Int. Cl.
*G11C 11/413* (2006.01)
*G11C 8/12* (2006.01)
*G11C 5/14* (2006.01)

(52) U.S. Cl.
CPC ............... *G11C 8/12* (2013.01); *G11C 5/147* (2013.01); *G11C 11/413* (2013.01)

(58) Field of Classification Search
CPC .......... G11C 8/12; G11C 5/147; G11C 11/413
See application file for complete search history.

(56) References Cited

U.S. PATENT DOCUMENTS

| | | | |
|---|---|---|---|
| 5,715,191 A | 2/1998 | Yamauchi et al. | |
| 7,099,230 B1 | 8/2006 | Tran | |
| 7,372,721 B2 | 5/2008 | Sachdev et al. | |
| 7,804,732 B2 | 9/2010 | Van Berkel | |
| 2004/0196724 A1* | 10/2004 | Chen | G11C 11/4074 365/230.05 |
| 2006/0050590 A1* | 3/2006 | Nautiyal | G11C 11/413 365/226 |
| 2006/0274569 A1* | 12/2006 | Joshi | H01L 27/0207 365/154 |
| 2017/0236577 A1* | 8/2017 | Abu-Rahma | G11C 11/418 365/154 |
| 2018/0211702 A1* | 7/2018 | Hanson | G11C 11/412 |

* cited by examiner

*Primary Examiner* — Khamdan N. Alrobaie
(74) *Attorney, Agent, or Firm* — Kowert, Hood, Munyon, Rankin & Goetzel, P.C.; Gareth M. Sampson (57) ABSTRACT

A memory array that provides an internal retention voltage without a voltage regulator is disclosed. The memory array includes a first group of bit cells coupled between the power supply rail and a ground switch and a second group of bit cells coupled to a retention select circuit. The retention select circuit is coupled to the ground for the first group of bit cells and the power supply rail. The ground switch and the retention select circuit may be operated to switch the bit cells between a nominal operating voltage and a retention voltage. The retention voltage is provided during inactive periods of the memory array to maintain data in the bit cells during the inactive periods.

20 Claims, 9 Drawing Sheets

SRAM BIT CELL RETENTION

BACKGROUND

Technical Field

Embodiments described herein relate to electronic circuits. More particularly, embodiments described herein relate to electronic memory circuits that retain data during periods of inactivity.

Description of the Related Art

Systems-on-chips ("SoCs") utilize memory arrays, such as SRAM (static random-access memory) arrays, that operate with both active periods (e.g., where the memory is being accessed by a processing unit) and inactive periods (e.g., idle intervals where the memory is not accessed). During the inactive periods, if the power to the memory arrays is maintained, the memory arrays have leakage current and power continues to be consumed by the memory arrays. One solution is to turn off a power rail providing power to the memory array (e.g., using power gating techniques). Many memory (e.g., SRAM) arrays, however, are arrays where data (e.g., stored values) in bit cells in the array needs to be retained during inactive periods. Thus, turning off the power rail providing power to the memory arrays is not possible as any data values stored in the bit cells will be lost when the power is turned off.

To overcome the problems with turning off the power to memory arrays while also providing reduction in leakage from the memory arrays, many memory arrays are implemented with a retention mode. In the retention mode, the voltage to the bit cells in memory arrays is reduced to a lower voltage for inactive periods to reduce leakage from the memory arrays and provide power savings. The voltage in the retention mode, however, is kept at a voltage level that is sufficient to reliably maintain the data values stored in the bit cells in the memory arrays.

Figure 1:
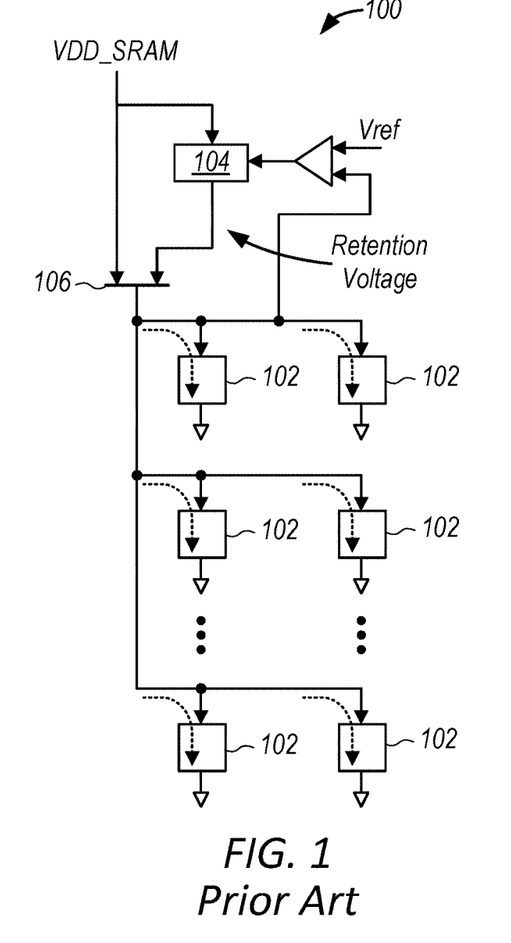
FIG. 1 depicts a block diagram of an example of one prior art method for providing a retention voltage to bit cells in memory array.

FIG. 1 depicts a block diagram of an example of one prior art method for providing a retention voltage to bit cells in a memory array. In memory array 100 in FIG. 1, the retention voltage for bit cells 102 is generated using voltage regulator 104, which is located internally in the memory array. Voltage regulator 104 may be, for example, a linear voltage regulator or a low drop-out regulator (LDO). Voltage selector 106 may switch the input voltage to bit cells 102 between the supply voltage (VDD_SRAM) and the retention voltage. One disadvantage to providing the retention voltage with voltage regulator 104 is that the voltage regulator dissipates energy while generating the retention voltage. Another disadvantage is that the voltage regulator 104 may occupy significant area in the integrated circuit that includes the memory array.

Figure 2:
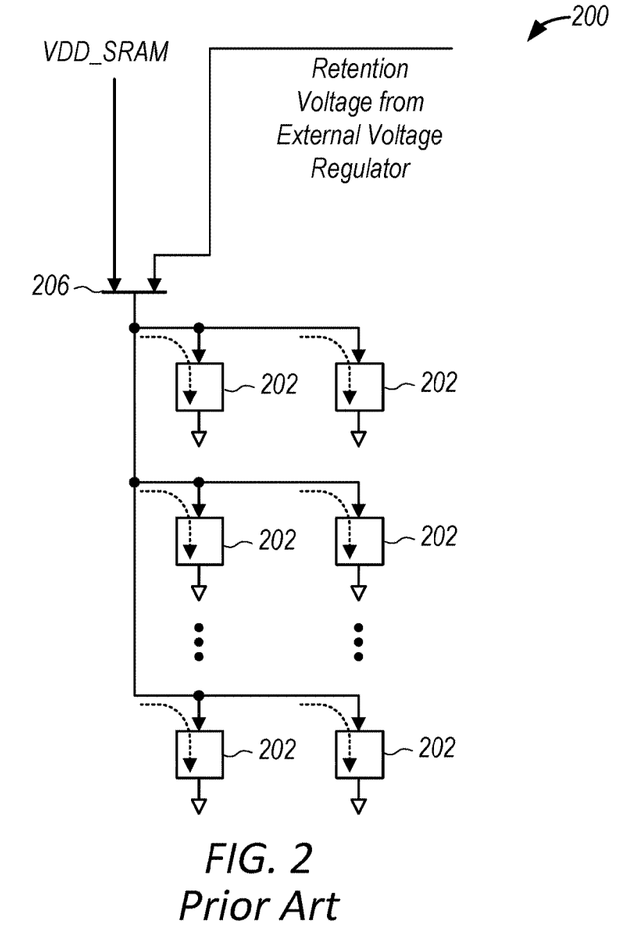
FIG. 2 depicts a block diagram of an example of another prior art method for providing a retention voltage to bit cells in memory array.
Figure 3:
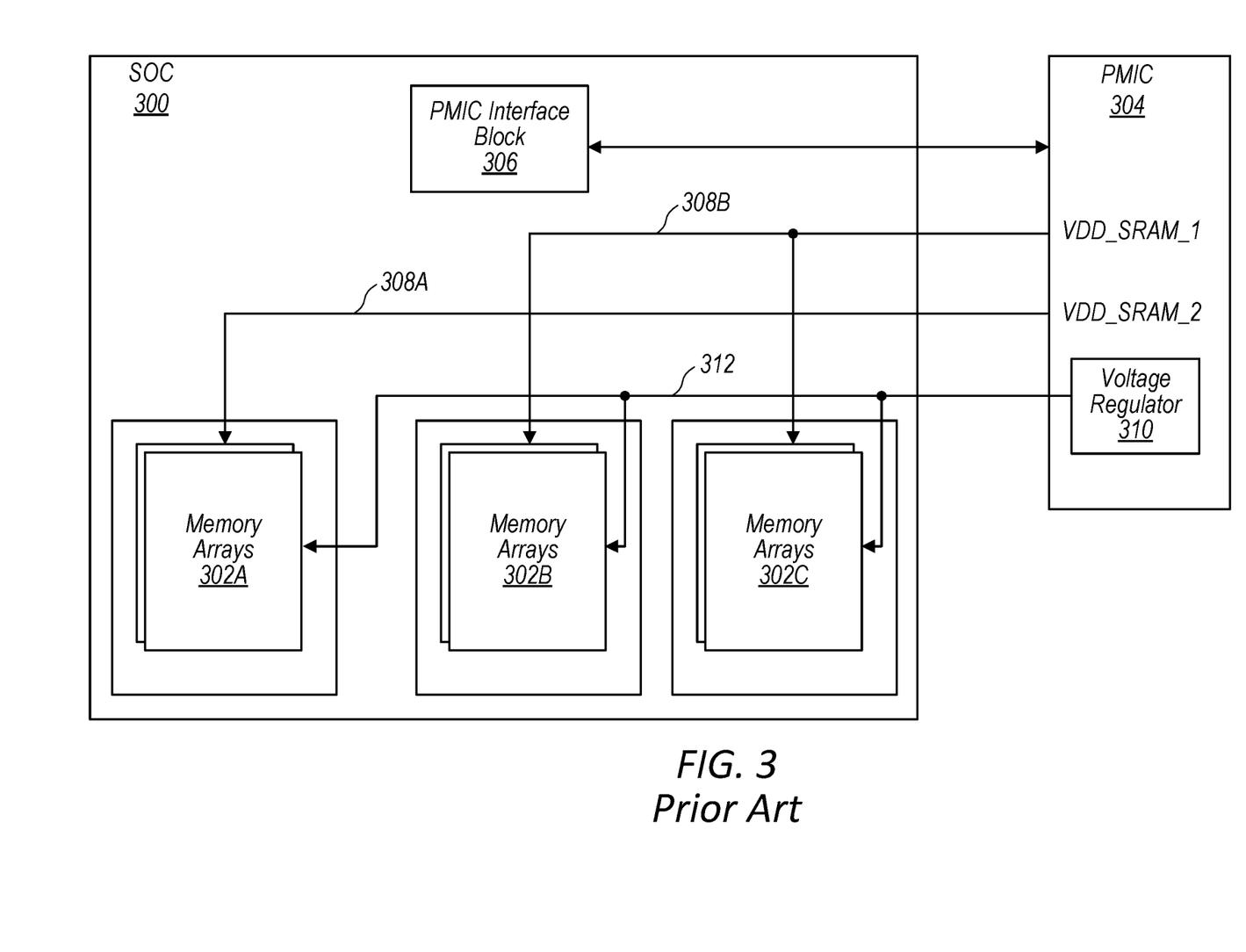
FIG. 3 depicts a block diagram of an example of a prior art method for providing a retention voltage to bit cells in memory arrays on an SoC from a PMIC ("power management integrated circuit").
Figure 4:
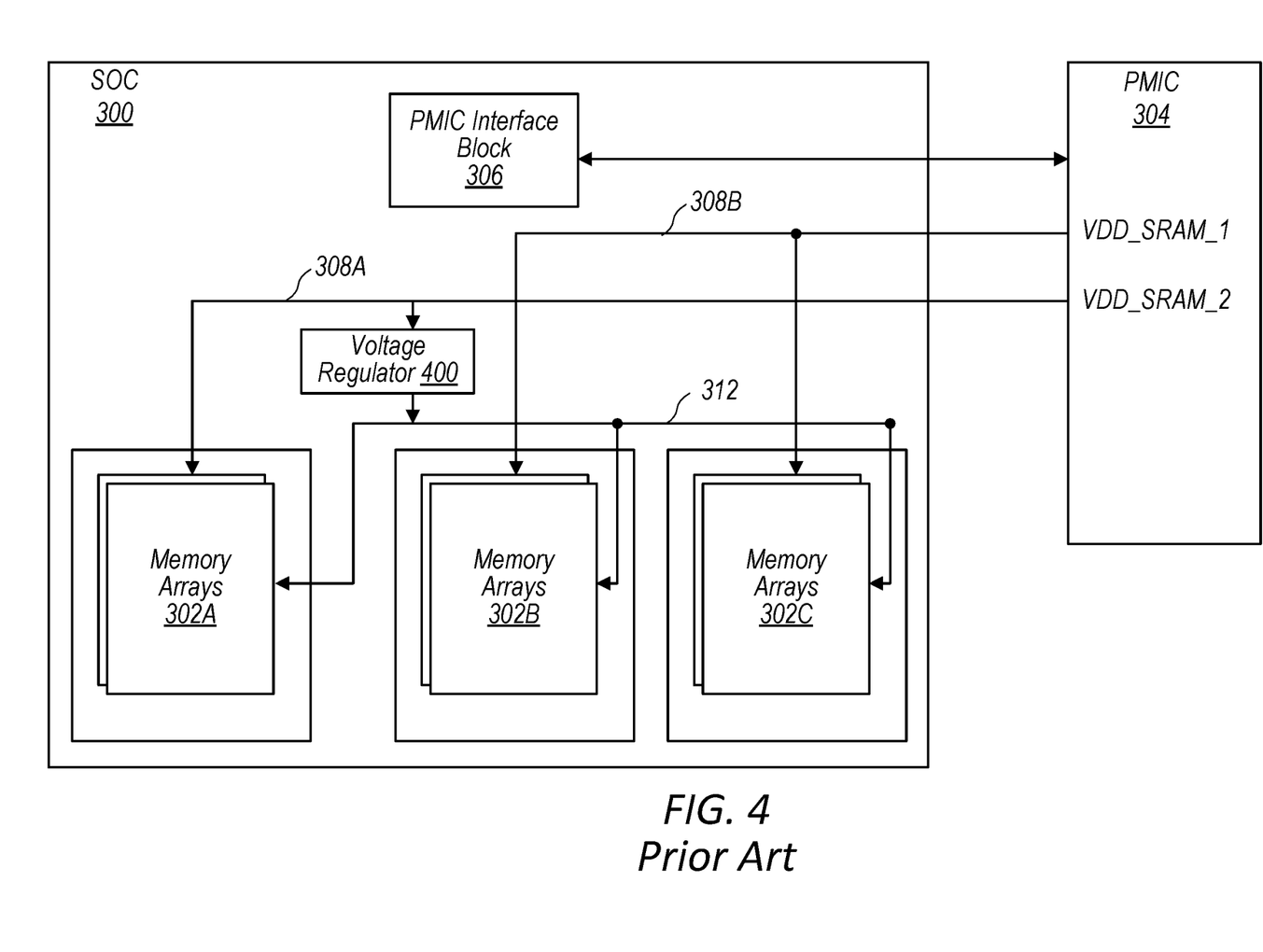
FIG. 4 depicts a block diagram of an example of a prior art method for providing a retention voltage to bit cells in memory arrays using a voltage regulator on an SoC that is external to the memory arrays.

FIG. 2 depicts a block diagram of an example of another prior art method for providing a retention voltage to bit cells in a memory array. In memory array 200 in FIG. 2, the retention voltage for bit cells 202 is generated from a voltage regulator located outside the memory array. For example, the voltage regulator is located external to memory array 200 and the retention voltage is provided from a retention rail, as shown in FIGS. 3 and 4. Voltage selector 206 may switch the input voltage to bit cells 202 between the supply voltage (VDD_SRAM) and the retention voltage.

FIG. 3 depicts a block diagram of an example of a prior art method for providing a retention voltage to bit cells in memory arrays on an SoC from a PMIC ("power management integrated circuit"). SoC 300 includes memory arrays 302A-C. SoC interfaces with PMIC 304 through PMIC interface block 306. PMIC 304 provides supply voltages to memory arrays 302A-C through voltage rail 308A and voltage rail 308B. Voltage rail 308A and voltage rail 308B provide different supply voltages (VDD_SRAM_1 or VDD_SRAM_2, respectively) to memory array 302A and memory arrays 302B-C.

As shown in FIG. 3, voltage regulator 310 provides the retention voltage to each of memory arrays 302A-C via voltage rail 312. Voltage regulator 310 includes, for example, a switch capacitance regulator or a buck capacitance regulator to provide the retention voltage. The retention voltage is lower than either supply voltage (VDD_SRAM_1 or VDD_SRAM_2) to reduce the power used during the retention mode. The retention voltage from voltage rail 312 is provided to bit cells in the memory arrays (e.g., such as bit cells 202 in memory array 200, as shown in FIG. 2).

FIG. 4 depicts a block diagram of an example of a prior art method for providing a retention voltage to bit cells in memory arrays using a voltage regulator on an SoC that is external to the memory arrays. In the example of FIG. 4, voltage regulator 400 is coupled between one of the supply voltage rails (e.g., voltage rail 308A) and voltage rail 312 (e.g., the retention voltage rail). Voltage regulator 400 transforms the voltage on voltage rail 308A to the retention voltage on voltage rail 312 (e.g., the retention voltage used by memory arrays 302A-C).

Providing the retention voltage to memory arrays 302A-C through voltage rail 312 using either voltage regulator 310 or voltage regulator 400, as shown in FIGS. 2-4, reduces the power overhead (e.g., leakage) versus using an internal voltage regulator (such as shown in FIG. 1). Providing the retention voltage through a voltage regulator external to the memory arrays, however, creates an area cost on SoC 300 due to the presence of voltage rail 312 in addition to any I/O pads used for the retention voltage coming from PMIC 304 (as shown in FIG. 3) or the presence of voltage regulator 400 (as shown in FIG. 4). Additionally, connecting voltage rail 312 to each memory array 302 that uses the retention voltage takes up wiring resources on SoC 300 that could be used for other functions.

SUMMARY

A memory array that includes at least two groups of bit cells is described. A first group of bit cells is coupled between the power supply rail and a ground switch. The ground switch may be open/closed to connect the ground for the first group of bit cells to a ground rail. A second group of bit cells is coupled to a retention select circuit (e.g., a retention switch or multiplexer) where the retention select circuit is coupled to the ground for the first group of bit cells and the power supply rail. The retention select circuit may switch the input to the second group of bit cells between the power supply rail and the ground for the first group of bit cells.

During active periods in the memory array (e.g., during an active mode of the memory array), the ground switch may be closed and the retention select circuit provides input from the power supply rail to the second group of bit cells such that all the bit cells receive nominal power from the power supply rail. During inactive periods (e.g. during a retention mode of the memory array), the ground switch may be opened and the retention select circuit provides input from the ground of the first group of bit cells to the second group of bit cells. Thus, each bit cell may be provided an input voltage from power supply rail during the retention mode that may divided by a factor of about two from the active mode input voltage. Additionally, the same leakage current flows through two bit cells and thus the current used for retaining 1 bit may be reduced by a factor of about two.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation-[entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 5:
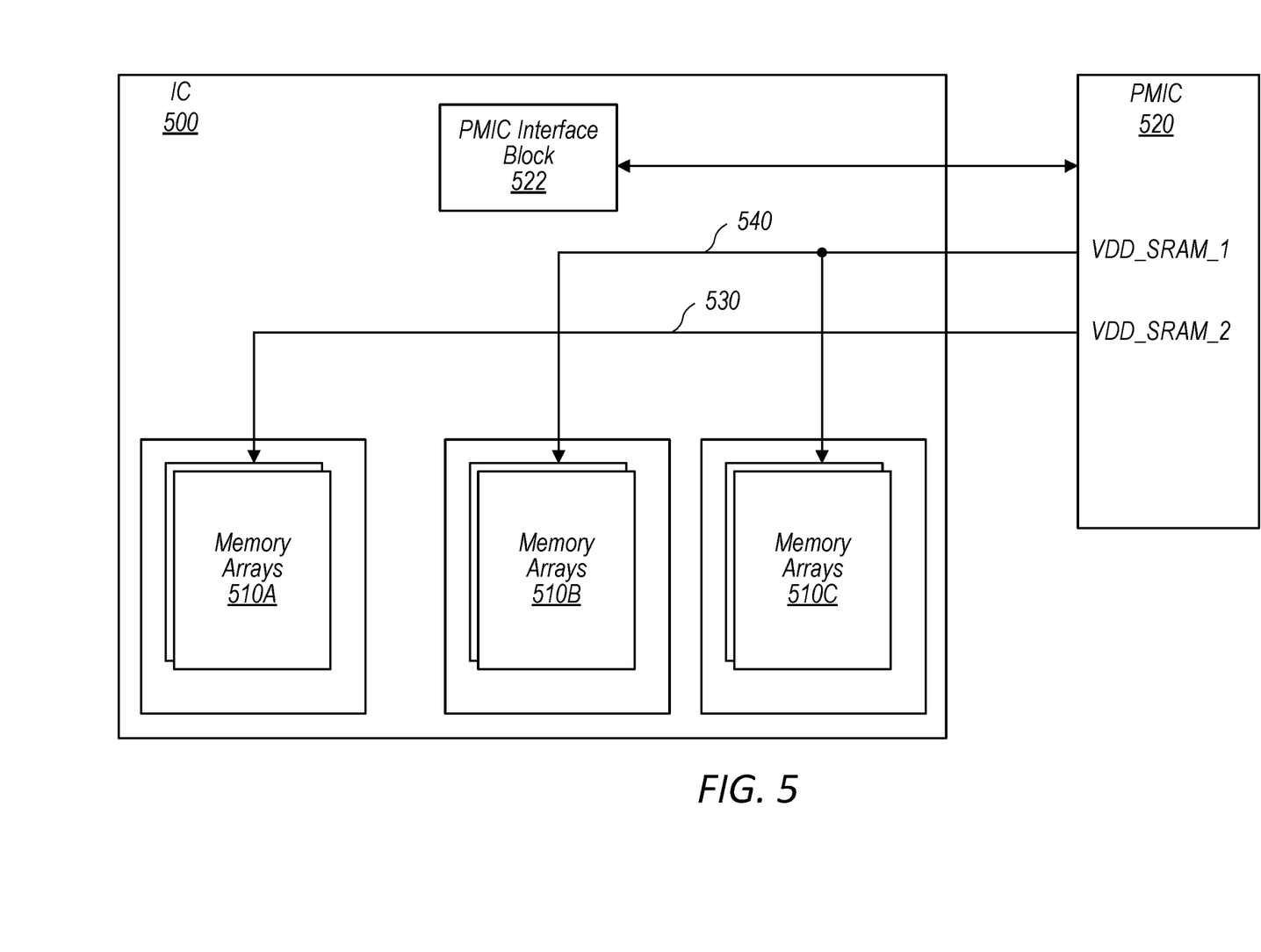
FIG. 5 depicts a block diagram of an embodiment of an integrated circuit (IC) and a power management integrated circuit (PMIC).

FIG. 5 depicts a block diagram of an embodiment of an integrated circuit (IC) and a power management integrated circuit (PMIC). In certain embodiments, IC 500 is an SoC (system on a chip). For example, IC 500 may include one or more processing units along with memory and input/output (I/O) ports associated with the processing units. In certain embodiments, IC 500 includes one or more memory arrays 510. In the embodiment shown, IC 500 includes memory array 510A, memory array 510B, and memory array 510C. Memory arrays 510 may be, for example, SRAM (static random-access memory) arrays. The scope of this disclosure may apply to any type of memory array using a retention voltage, as well as others not explicitly mentioned herein. The number of memory arrays shown here is by way of example as well, as the disclosure is not limited to any particular number.

In various embodiments, memory arrays 510 are coupled to functional circuit blocks (e.g., processing units) in IC 500. Processing units are not shown in FIG. 5 for clarity in the figure. Processing units may include, for example, general purpose processor cores, central processing units (CPUs), graphics processing units (GPUs), digital signal processing units, various peripheral circuitry such as audio or video processing hardware, storage peripherals, external peripheral interface controllers, communication peripherals, networking peripherals, or virtually any other kind of functional unit/circuitry configured to perform a processing function.

In the embodiment shown, IC 500, and the circuitry therein, is coupled to a power management integrated circuit (PMIC) 520. PMIC 520 may provide supply voltages to circuitry in IC 500, including memory arrays 510. IC 500 may interface with PMIC 520 through PMIC interface block 522. PMIC interface block 522 may, for example, provide a communication interface between IC 500 and PMIC 520 for controlling voltages provided from PMIC 520 to IC 500.

PMIC 520 may include various circuitry for power management. In certain embodiments, PMIC 520 includes power management circuitry that adjusts the voltages for various reasons, such as controlling performance levels, thermal output, and/or power consumption. In various embodiments, other power management units may be coupled to IC 500, including additional instances of PMIC 520. PMIC 520 is thus shown here as an exemplary power management unit, but is not intended to limit the scope of this disclosure. For example, embodiments may be contemplated where PMIC 520 is a power management unit located on IC 500 and separate from memory arrays 510 and processing units in IC 500.

As shown in FIG. 5, PMIC 520 provides power to memory arrays 510 using voltage rail 530 and voltage rail 540. In the embodiment shown, voltage rail 530 provides power from PMIC 520 to memory array 510A while voltage rail 540 provides power from PMIC 520 to memory array 510B and memory array 510C. For example, memory array 510A, memory array 510B, and memory array 510C receive nominal supply voltages from PMIC 520 (e.g., VDD_SRAM_1 or VDD_SRAM_2). Other embodiments may have more supply voltages or may have one supply voltage for the memory arrays 510. In certain embodiments, one or more of memory array 510A, memory array 510B, and memory array 510C are memory arrays that operate in an active mode (e.g., during periods of activity of the memory array) and a retention mode (e.g., during periods of inactivity of the memory array). During the active mode, such a memory array provides the nominal supply voltage to bit cells in the memory array. During the retention mode, as described below, such a memory array may internally provide a retention voltage to the bit cells in the memory array to maintain values in the bit cells during periods of inactivity.

Figure 6:
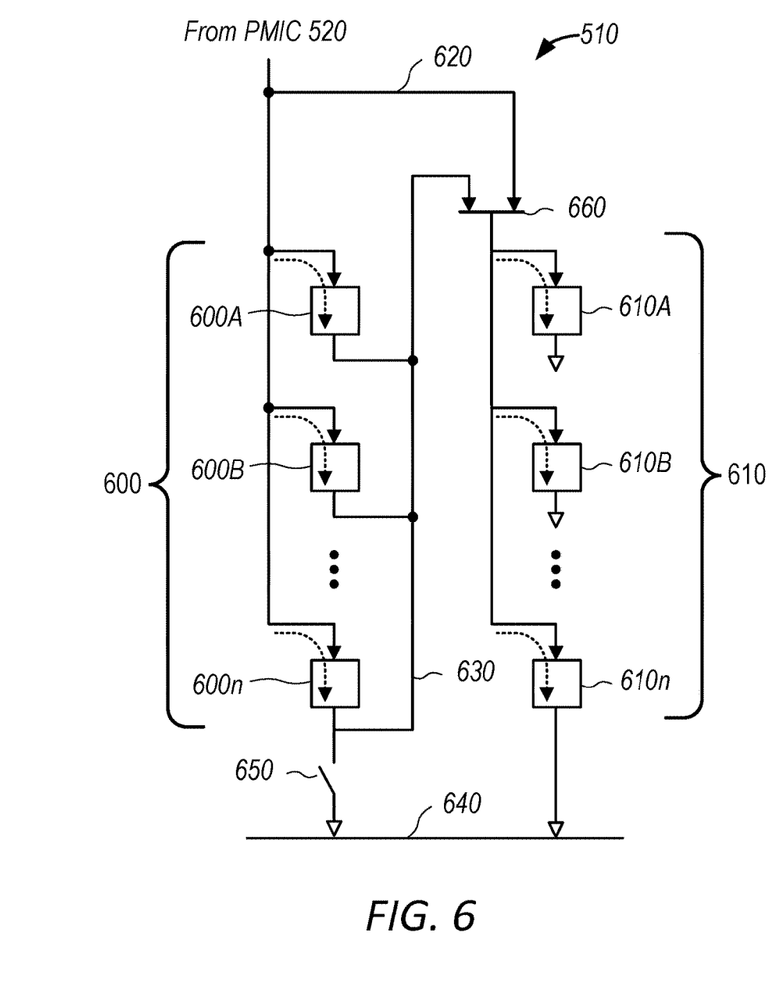
FIG. 6 depicts a block diagram of an embodiment of a memory array.

FIG. 6 depicts a block diagram of an embodiment of memory array 510. In certain embodiments, memory array 510 is a SRAM (static random-access memory) array. Memory array 510 may operate in at least an active mode (e.g., where the memory is being accessed by a processing unit) and a retention mode (e.g., idle intervals where the memory is inactive), as described herein. In the embodiment shown, memory array 510 includes a first group of bit cells 600 and a second group of bit cells 610. In certain embodiments, each group of bit cells includes a number, n, of bit cells. Thus, the first group of bit cells includes bit cells 600A-600n while the second group of bit cells includes bit cells 610A-610n.

In certain embodiments, bit cells 600A-600n in the first group of bit cells 600 are coupled to the same power source and the same ground source. As shown in FIG. 6, bit cells 600A-600n are coupled to voltage rail 620 (e.g., the power source for the first bit cells) and ground 630 (e.g., the ground source for the first bit cells). Ground 630 may be coupled to ground rail 640 using ground switch 650. Ground switch 650 may control coupling and uncoupling between ground 630 and ground rail 640 based on the mode of memory array 510, as described herein. Ground rail 640 may be the ground rail associated with voltage rail 620. Voltage rail 620 may receive the supply voltage for memory array 510 from PMIC 520 (e.g., VDD_SRAM_1 or VDD_SRAM_2, as shown in FIG. 5).

In certain embodiments, bit cells 610A-610n in the second group of bit cells 610 are coupled to the same power source and the same ground source. As shown in FIG. 6, bit cells 610A-610n are coupled to retention select circuit 660 and ground rail 640. Retention select circuit 660 may select between receiving a supply voltage for the second group of bit cells 610 from voltage rail 620 or receiving a supply voltage for the second group of bit cells 610 from ground 630 of the first group of bit cells 600. As such, retention select circuit 660 determines the power source for the second group of bit cells 610 by selecting between voltage rail 620 and ground 630. In certain embodiments, retention select circuit 660 determines the power source for the second group of bit cells 610 based on the mode of memory array 510, as described herein. Retention select circuit 660 may include, for example, a switch (such as a multiplexer) to select between voltage rail 620 and ground 630.

In certain embodiments, ground switch 650 and retention select circuit 660 operate together to switch memory array 510 between its active mode and its retention mode. Ground switch 650 and retention select circuit 660 may operate to switch the mode of memory array 510 in response to signals from a processing unit or other functional circuit block in IC 500. For example, the mode of memory array 510 may be switched based on a change in temperature as detected by one or more temperature sensors in IC 500 (such as the sensed temperature being above or below a threshold). As another example, the mode of memory array 510 may be switched in response to activity of a processor unit in IC 500 (or a process on the processor unit) coupled to the memory array being determined to be slowing down below an activity threshold.

Figure 7:
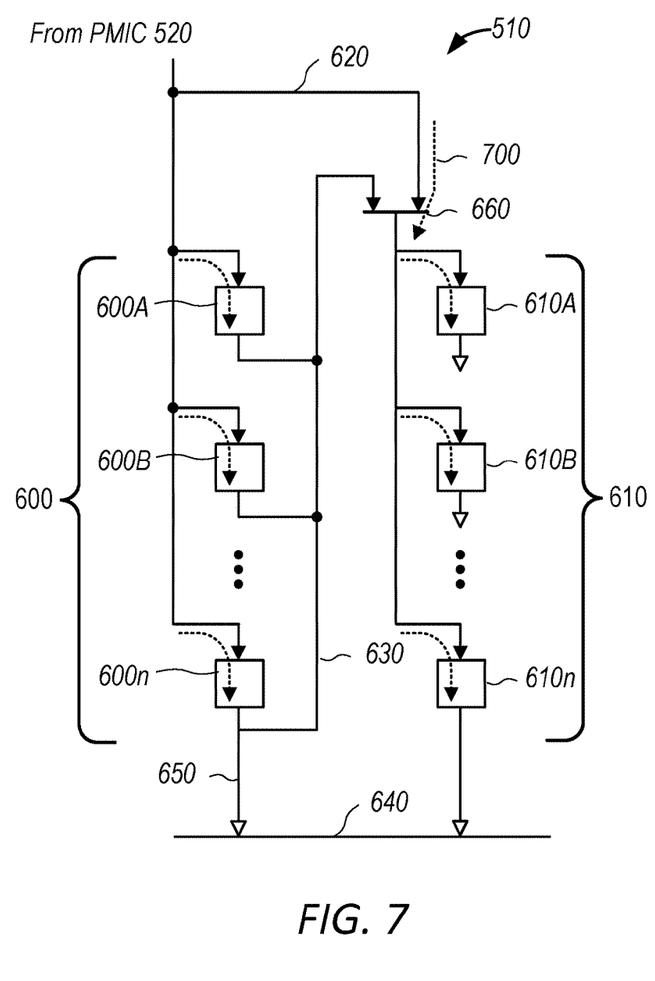
FIG. 7 depicts a block diagram of an embodiment of a memory array in an active mode.

FIG. 7 depicts a block diagram of an embodiment of memory array 510 in an active mode. In certain embodiments, as described herein, an active mode includes a mode for memory array 510 where bit cells 600 and bit cells 610 are accessed by a processing unit in IC 500. In the active mode, ground switch 650 is closed between the first group of bit cells 600 and ground rail 640 to couple the first group of bit cells to the ground rail. Thus, ground rail 640 is directly connected to the first group of bit cells 600 in the active mode.

At the same time during the active mode, retention select circuit 660 selects voltage rail 620 to provide the supply voltage to the second group of bit cells 610 (shown by arrow 700 in FIG. 7). For example, retention select circuit 660 closes the electrical connection between voltage rail 620 and the second group of bit cells 610 and opens the electrical connection between ground 630 and the second group of bit cells 610. The second group of bit cells 610 is also directly connected to ground rail 640. Thus, in the active mode, the second group of bit cells 610 receives the same supply voltage as the first group of bit cells 600. As such, the two groups of bit cells are electrically coupled in parallel between voltage rail 620 and ground rail 640 and all bit cells (bit cells 600A-n and bit cells 610A-n) may receive the same voltage and current when both groups of bit cells include the same number of bit cells. During the active mode, the values in bit cells 600A-n and bit cells 610A-n are changed as needed depending on the processor unit accessing memory array 510.

Figure 8:
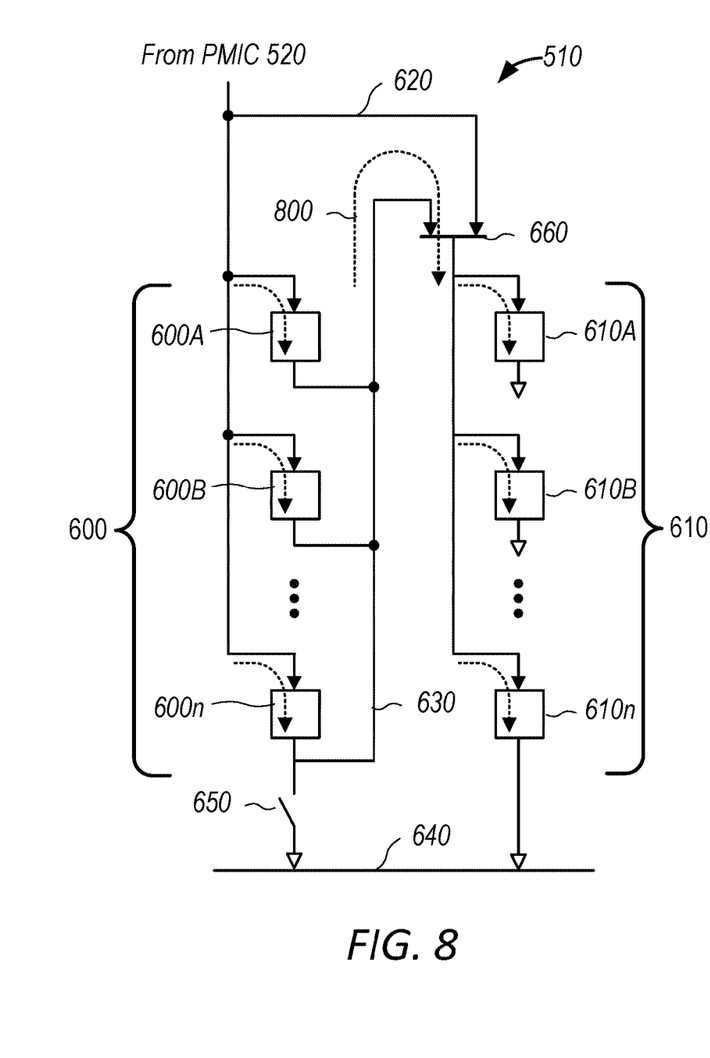
FIG. 8 depicts a block diagram of an embodiment of a memory array in a retention mode.

FIG. 8 depicts a block diagram of an embodiment of memory array 510 in a retention mode. In certain embodiments, as described herein, a retention mode includes a mode for memory array 510 where bit cells 600 and bit cells 610 are inactive. In the retention mode of memory array 510, a minimum voltage needs to be maintained in bit cells 600 and bit cells 610 such that the bit cells do not lose their stored values. In the retention mode, ground switch 650 is opened and retention select circuit 660 selects ground 630 to provide the supply voltage to the second group of bit cells 610 (e.g., retention select circuit 660 opens the electrical connection between voltage rail 620 and the second group of bit cells 610 and closes the electrical connection between ground 630 and the second group of bit cells 610). The supply voltage for the second group of bit cells 610 is shown by arrow 800 in FIG. 8. Ground rail 640 is thus connected to the first group of bit cells 600 through the second group of bit cells 610. As such, the first group of bit cells 600 and the second group of bit cells 610 are coupled in series in the retention mode (e.g., the first group of bit cells 600 is in a cascade connection with the second group of bit cells 610 between voltage rail 620 and ground rail 640).

With the series (cascade) connection from the first group of bit cells 600 to the second group of bit cells 610 in the retention mode, the voltage provided across each bit cell in memory array 510 is reduced by approximately a factor of 2 during the retention mode (e.g., the retention voltage is approximately 2 the nominal voltage). Additionally, with the series connection in the retention mode instead of the parallel connection in the active mode, the same voltage provided from voltage rail 620 to the bit cells in memory array 510 is now loaded by twice the number of bit cells (e.g., approximately twice the resistance) in the retention mode as compared to the active mode. As such, the leakage current through each bit cell in the retention mode is approximately 2 the leakage current through each bit cell in the active mode. Thus, the series (cascade) connection from the first group of bit cells 600 to the second group of bit cells 610 in the retention mode provides reduced power consumption by memory array 510 versus power consumption by the memory array in the active mode. In some embodiments, reduction in power consumption by memory array 510 in the retention mode shown in FIG. 8 is similar to reductions in power consumption by memory arrays when using an external voltage regulator to provide the retention voltage (as shown in FIGS. 2-4).

In the embodiment of memory array shown in FIGS. 6-8, memory array 510 includes two groups of bit cells 600, 610 with the groups of bit cells arranged in columns. The embodiment of memory array 510 in FIGS. 6-8 is, however, provided as a non-limiting example of dividing bit cells in a memory array into groups of bit cells. For example, additional embodiments may be contemplated where the groups of bit cells are arranged by rows instead of columns. As another example, the number of groups of bit cells may be greater than two groups of bit cells.

Figure 9:
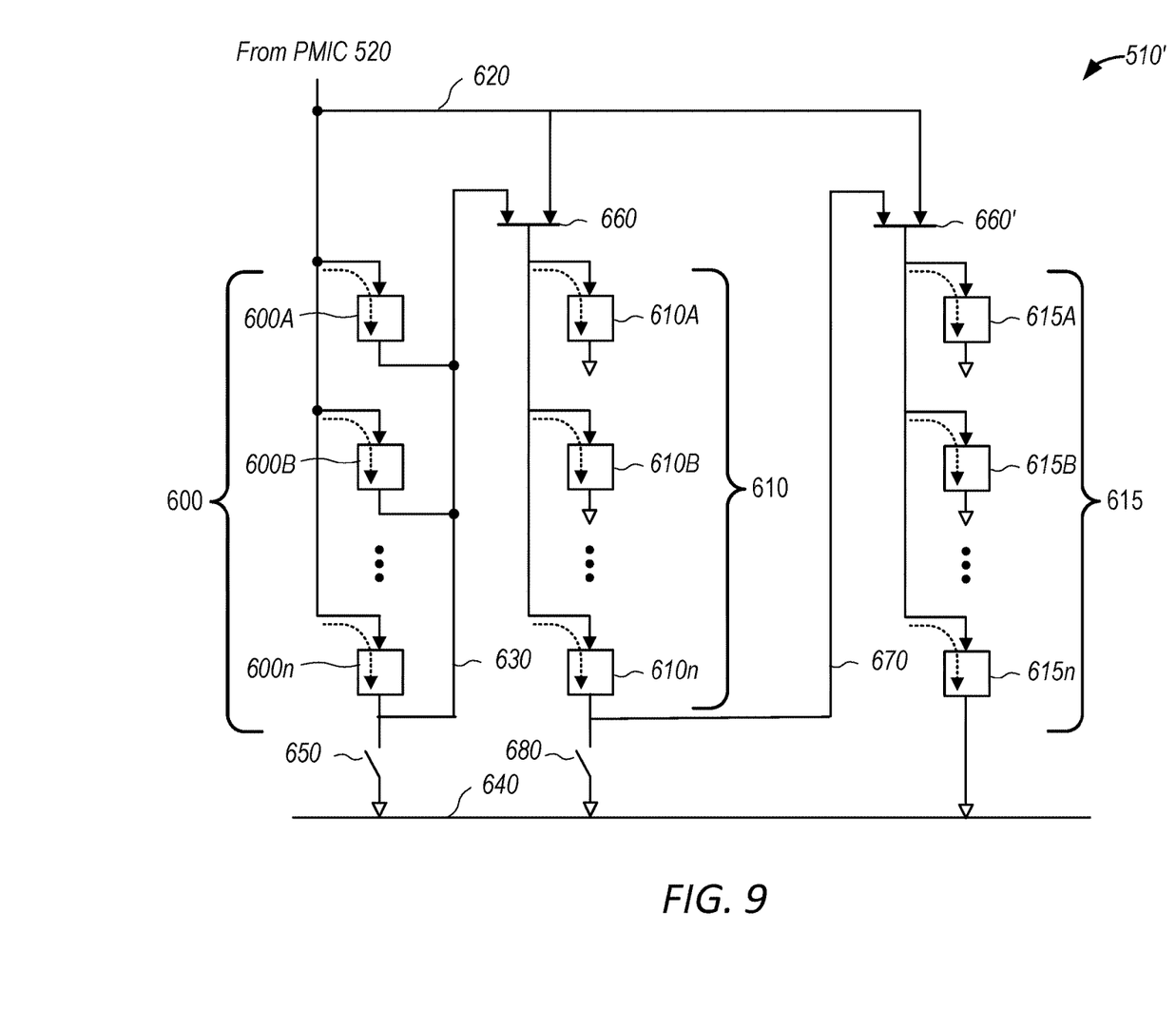
FIG. 9 depicts a block diagram of an embodiment of a memory array with three groups of bit cells.

FIG. 9 depicts a block diagram of an embodiment of memory array 510' with three groups of bit cells. Memory array 510' includes first group of bit cells 600, second group of bit cells 610, and third group of bit cells 615. While three groups of bit cells (e.g., first group of bit cells 600, second group of bit cells 610, and third group of bit cells 615) are depicted in FIG. 9, additional embodiments may be contemplated with more than three groups of bit cells. Additional groups of bit cells may be coupled similarly to the disclosed embodiments to provide either the supply voltage or the retention voltage to the bit cells in the additional groups. The first group of bit cells 600, similar to the embodiment in FIG. 6, includes bit cells 600A-n coupled to voltage rail 620 and ground 630 with ground 630 coupled to ground rail 640 using ground switch 650. The second group of bit cells, also similar to the embodiment in FIG. 6, includes bit cells 610A-610n coupled to retention select circuit 660. In the present embodiment, however, bit cells 610A-610n are coupled to ground 670 with ground 670 coupled to ground rail 640 using ground switch 680. Retention select circuit 660 is coupled to both voltage rail 620 and ground 630. Retention select circuit 660 may select between receiving a supply voltage for the second group of bit cells 610 from voltage rail 620 or receiving a supply voltage for the second group of bit cells 610 from ground 630 of the first group of bit cells 600.

As shown in FIG. 9, memory array 510' includes third group of bit cells 615 along with the first group of bit cells 600 and the second group of bit cells 610. The third group of bit cells 615 includes bit cells 615A-615n coupled to retention select circuit 660' and ground rail 640. Retention select circuit 660' may be coupled to ground 670 of the second group of bit cells 610 and voltage rail 620. Thus, similar to retention select circuit 660, retention select circuit 660' may select between receiving a supply voltage for the third group of bit cells 615 from voltage rail 620 or receiving a supply voltage for the third group of bit cells 615 from ground 670 of the second group of bit cells 610.

For the active mode of memory array 510', ground switch 650 and ground switch 680 may be closed to couple ground 630 and ground 670, respectively, to ground rail 640 while retention select circuit 660 selects voltage rail 620 to provide the supply voltage to the second group of bit cells 610 and retention select circuit 660' selects voltage rail 620 to provide the supply voltage to the third group of bit cells 615. For the retention mode of memory array 510', ground switch 650 and ground switch 680 are opened to disconnect ground 630 and ground 670 from ground rail 640 while retention select circuit 660 selects ground 630 to provide the supply voltage to the second group of bit cells 610 and retention select circuit 660' selects ground 670 to provide the supply voltage to the third group of bit cells 615.

The embodiments for providing a retention voltage internally in a memory array described herein (e.g., memory array 510 or memory array 510') allow a retention voltage to be provided to the bit cells to maintain values in the bit cells during inactivity without the use of an internal voltage regulator or external voltage regulator. Such embodiments provide the benefit of power reduction during a retention mode that is similar or better to an external voltage regulator while avoiding the increased cost and resources needed for the external voltage regulator. The cascade connection of the groups of bit cells in memory array 510 and memory array 510' during the retention mode reduces leakage from the memory arrays without utilizing significant area and wiring resources in the memory arrays.

Example Method

Figure 10:
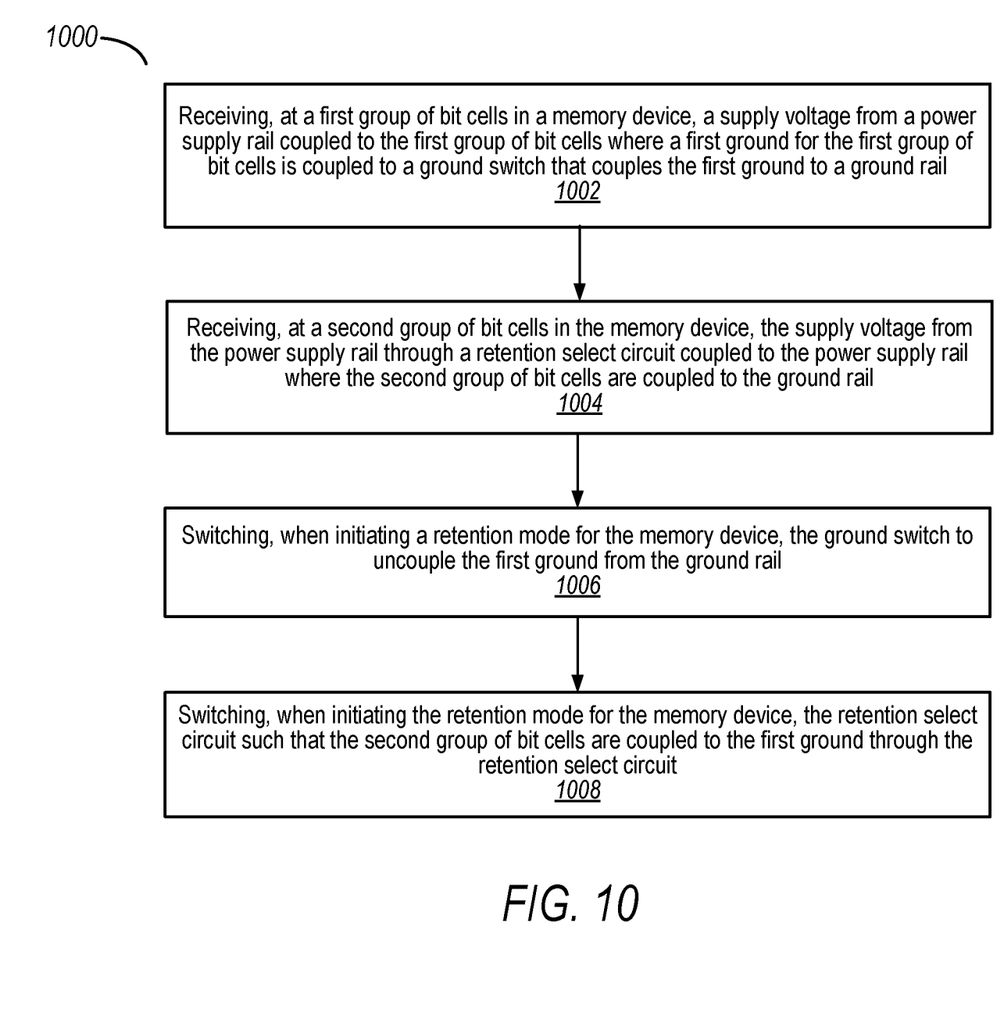
FIG. 10 is a flow diagram illustrating a method for switching a memory array into a retention mode, according to some embodiments.

FIG. 10 is a flow diagram illustrating a method for switching a memory array into a retention mode, according to some embodiments. Method 1000 may be implemented using any of the embodiments of a sensor circuit as disclosed herein, in conjunction with any circuitry or other mechanism to solve for voltage and temperature based on respective ring oscillator frequencies.

At 1002, in the illustrated embodiment, a first group of bit cells in a memory device receives a supply voltage from a power supply rail coupled to the first group of bit cells where a first ground for the first group of bit cells is coupled to a ground switch that couples the first ground to a ground rail.

At 1004, in the illustrated embodiment, a second group of bit cells in a memory device receives the supply voltage from the power supply rail through a retention select circuit coupled to the power supply rail where the second group of bit cells are coupled to the ground rail. In some embodiments, the retention select circuit includes a multiplexer that selectively couples the second group of bit cells to either the power supply rail or the first ground.

At 1006, in the illustrated embodiment, when initiating a retention mode for the memory device, the ground switch switches to uncouple the first ground from the ground rail. In some embodiments, the retention mode for the memory device is initiated in response to activity of at least one process on at least one processor unit coupled to the memory device being determined to be slowing down below an activity threshold or the at least one processor being powered off. In some embodiments, the retention mode for the memory device is initiated in response to a temperature of the memory device being above or below a threshold.

At 1008, in the illustrated embodiment, when initiating the retention mode for the memory device, the retention select circuit switches such that the second group of bit cells are coupled to the first ground through the retention select circuit. In some embodiments, during the retention mode for the memory device, the first group of bit cells and the second group of bit cells receive a voltage that is about half the supply voltage. In some embodiments, during the retention mode for the memory device, the first group of bit cells and the second group of bit cells receive a voltage from the supply voltage that maintains data in the bit cells.

In some embodiments, when terminating the retention mode for the memory device, the ground switch switches to couple the first ground to the ground rail and the retention select circuit switches such that the second group of bit cells are coupled to the power supply rail through the retention select circuit.

Example Computer System

Figure 11:
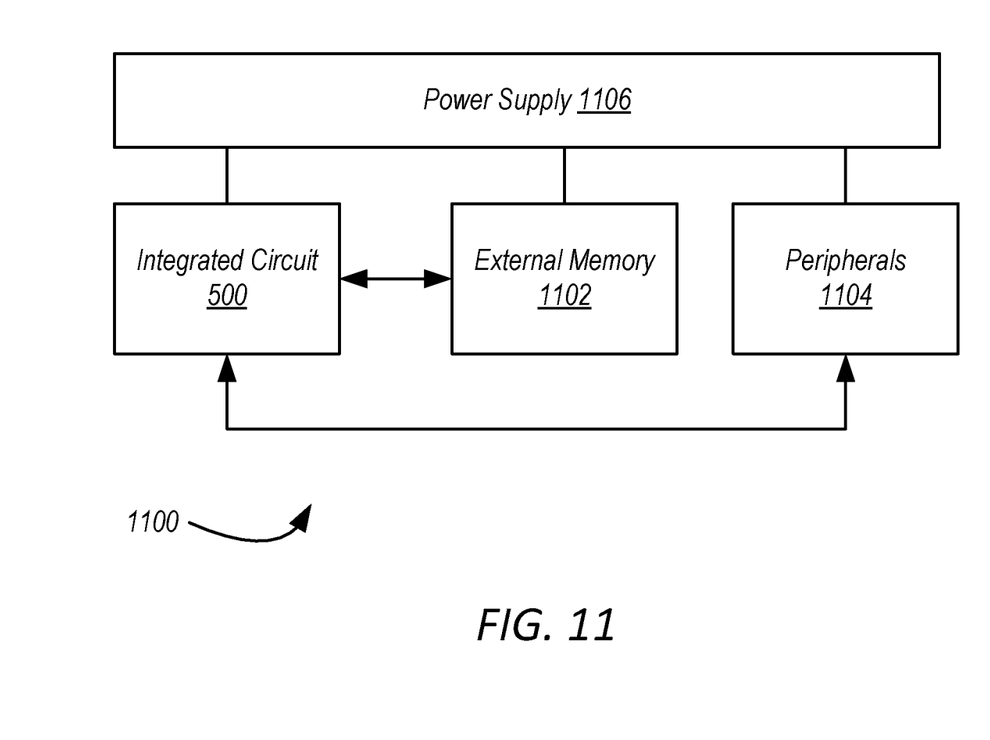
FIG. 11 is a block diagram of one embodiment of an example system.

Turning next to FIG. 11, a block diagram of one embodiment of a system 1100 is shown. In the illustrated embodiment, the system 1100 includes at least one instance of an integrated circuit 500 coupled to external memory 1102. The integrated circuit 500 may include a memory controller that is coupled to the external memory 1102. The integrated circuit 500 is coupled to one or more peripherals 1104 and the external memory 1102. A power supply 1106 is also provided which supplies the supply voltages to the integrated circuit 500 as well as one or more supply voltages to the memory 1102 and/or the peripherals 1104. In some embodiments, more than one instance of the integrated circuit 500 may be included (and more than one external memory 1102 may be included as well).

The peripherals 1104 may include any desired circuitry, depending on the type of system 1100. For example, in one embodiment, the system 1100 may be a mobile device (e.g. personal digital assistant (PDA), smart phone, etc.) and the peripherals 1104 may include devices for various types of wireless communication, such as WiFi, Bluetooth, cellular, global positioning system, etc. The peripherals 1104 may also include additional storage, including RAM storage, solid-state storage, or disk storage. The peripherals 1104 may include user interface devices such as a display screen, including touch display screens or multitouch display screens, keyboard or other input devices, microphones, speakers, etc. In other embodiments, the system 1100 may be any type of computing system (e.g. desktop personal computer, laptop, workstation, tablet, etc.).

The external memory 1102 may include any type of memory. For example, the external memory 1102 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 1102 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A memory device, comprising:
   a first group of bit cells coupled to a power supply rail;
   a ground switch coupled to the first group of bit cells, wherein the ground switch is configured to open or close a coupling of a first ground of the first group of bit cells to a ground rail;
   a retention select circuit coupled to the first ground and the power supply rail; and
   a second group of bit cells coupled to the retention select circuit, wherein the second group of bit cells are coupled to the ground rail;
   wherein the retention select circuit is configured to switch coupling of a power supply input to the second group of bit cells between the first ground and the power supply rail.

2. The memory device of claim 1, wherein, during an active mode of the memory device, the ground switch closes the coupling of the first ground of the first group of bit cells to the ground rail, and the retention select circuit couples the power supply input to the second group of bit cells to the power supply rail.

3. The memory device of claim 1, wherein, during a retention mode of the memory device, the ground switch opens the coupling of the first ground of the first group of bit cells to the ground rail, and the retention select circuit couples the power supply input to the second group of bit cells to the first ground.

4. The memory device of claim 3, wherein, during the retention mode, the first group of bit cells and the second group of bit cells receive a voltage needed to maintain data in the bit cells.

5. The memory device of claim 1, wherein the power supply rail is coupled to a power management integrated circuit.

6. The memory device of claim 1, wherein the retention select circuit includes a multiplexer that selects input between the power supply rail and the first ground.

7. The memory device of claim 1, further comprising:
   a second ground switch coupled to the second group of bit cells, wherein the second ground switch is configured to open or close a coupling of a second ground of the second group of bit cells to the ground rail;
   a second retention select circuit coupled to the second ground and the power supply rail; and
   a third group of bit cells coupled to the second retention select circuit, wherein the third group of bit cells are coupled to the ground rail;
   wherein the second retention select circuit is configured to switch coupling of the power supply input to the third group of bit cells between the second ground and the power supply rail.

8. The memory device of claim 7, wherein, during an active mode of the memory device, the ground switch closes the coupling of the first ground of the first group of bit cells to the ground rail, the second ground switch closes the coupling of the second ground of the second group of bit cells to the ground rail, the retention select circuit couples the power supply input to the second group of bit cells to the power supply rail, and the second retention select circuit couples the power supply input to the third group of bit cells to the power supply rail.

9. The memory device of claim 7, wherein, during a retention mode of the memory device, the ground switch opens the coupling of the first ground of the first group of bit cells to the ground rail, the second ground switch opens the coupling of the second ground of the second group of bit cells to the ground rail, the retention select circuit couples the power supply input to the second group of bit cells to the first ground, and the second retention select circuit couples the power supply input to the third group of bit cells to the first ground.

10. A method, comprising:
    receiving, at a first group of bit cells in a memory device, a supply voltage from a power supply rail coupled to the first group of bit cells, wherein a first ground for the first group of bit cells is coupled to a ground switch that couples the first ground to a ground rail;
    receiving, at a second group of bit cells in the memory device, the supply voltage from the power supply rail through a retention select circuit coupled to the power supply rail, wherein the second group of bit cells are coupled to the ground rail;
    switching, when initiating a retention mode for the memory device, the ground switch to uncouple the first ground from the ground rail; and
    switching, when initiating the retention mode for the memory device, the retention select circuit such that the second group of bit cells are coupled to the first ground through the retention select circuit.

11. The method of claim 10, wherein, during the retention mode for the memory device, the first group of bit cells and the second group of bit cells receive a voltage that is about half the supply voltage.

12. The method of claim 10, wherein, during the retention mode for the memory device, the first group of bit cells and the second group of bit cells receive a voltage from the supply voltage that maintains data in the bit cells.

13. The method of claim 10, further comprising:
    switching, when terminating the retention mode for the memory device, the ground switch to couple the first ground to the ground rail; and
    switching, when terminating the retention mode for the memory device, the retention select circuit such that the second group of bit cells are coupled to the power supply rail through the retention select circuit.

14. The method of claim 10, wherein the retention select circuit includes a multiplexer that selectively couples the second group of bit cells to either the power supply rail or the first ground.

15. The method of claim 10, further comprising initiating the retention mode for the memory device in response to activity of at least one process on at least one processor unit coupled to the memory device being determined to be slowing down below an activity threshold.

16. The method of claim 10, further comprising initiating the retention mode for the memory device in response to a temperature of the memory device being above or below a threshold.

17. A memory device, comprising:
    a plurality of memory arrays coupled to a power supply rail, wherein each memory array includes:
    a first group of bit cells coupled to the power supply rail;

a ground switch coupled to the first group of bit cells, wherein the ground switch is configured to open or close a coupling of a first ground of the first group of bit cells to a ground rail;

a retention select circuit coupled to the first ground and the power supply rail; and a second group of bit cells coupled to the retention select circuit, wherein the second group of bit cells are coupled to the ground rail;

wherein the retention select circuit is configured to switch coupling of a power supply input to the second group of bit cells between the first ground and the power supply rail.

18. The memory device of claim 17, wherein, during an active mode of at least one memory array, the ground switch closes the coupling of the first ground of the first group of bit cells to the ground rail, and the retention select circuit couples the power supply input to the second group of bit cells to the power supply rail.

19. The memory device of claim 17, wherein, during a retention mode of at least one memory array, the ground switch opens the coupling of the first ground of the first group of bit cells to the ground rail, and the retention select circuit couples the power supply input to the second group of bit cells to the first ground.

20. The memory device of claim 17, wherein the plurality of memory arrays are located on an integrated circuit, and wherein the power supply rail is coupled to a power management integrated circuit separate from the integrated circuit.

* * * * *